(12) United States Patent
Prince et al.

(10) Patent No.: US 6,208,517 B1
(45) Date of Patent: Mar. 27, 2001

(54) HEAT SINK

(75) Inventors: Stephen T. Prince, Austin; Toby D. Cole, Del Valle; Kevin C. Brundidge, Cedar Creek; Larry W. Tucker, Dallas, all of TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/393,419

(22) Filed: Sep. 10, 1999

(51) Int. Cl.[7] .................................................. H05H 7/20
(52) U.S. Cl. .......................... 361/704; 165/80.3; 165/185; 174/16.3; 257/707; 257/713; 257/719; 361/710; 361/720
(58) Field of Search ..................... 24/295–296, 457–458, 24/573, 625; 165/80.2, 80.3, 185; 174/16.3; 257/706–707, 712–713, 722, 726–727, 718–719; 248/505, 510; 361/690, 697, 704, 707, 709–710, 719–720

(56) References Cited

U.S. PATENT DOCUMENTS

| | | |
|---|---|---|
| 2,772,382 * 11/1956 | Escoffery | ............................ 361/690 |
| 4,605,058 * 8/1986 | Wilens | ................................ 165/80.2 |
| 4,660,123 4/1987 | Hermann . | |
| 4,833,569 5/1989 | Probst . | |
| 4,926,935 * 5/1990 | Haushalter | ............................ 165/185 |
| 5,184,281 * 2/1993 | Samarov et al. | ...................... 361/704 |
| 5,257,162 * 10/1993 | Crafts | ................................... 361/704 |
| 5,541,811 * 7/1996 | Henningsson et al. | ............... 361/704 |
| 5,717,248 2/1998 | Neumann et al. . | |
| 5,786,633 7/1998 | Wolfgang et al. . | |
| 5,844,313 12/1998 | Hoffmann . | |
| 5,893,409 4/1999 | Kohler et al. . | |
| 6,035,523 * 3/2000 | McNeil et al. | ....................... 257/718 |

* cited by examiner

Primary Examiner—Gregory Thompson
(74) Attorney, Agent, or Firm—Williams, Morgan & Amerson, P.C.

(57) ABSTRACT

A heat sink includes mounting feet, a plurality of folds, and a clip. Each of the folds has a base portion, and the clip couples at least two of the folds together to inhibit fanning in at least a contact region defined by adjacent base portions. An apparatus includes a printed circuit board, mounting receptacles on the printed circuit board, a heat sink, and a device package. The heat sink includes feet adapted to interface with the mounting receptacles, a plurality of folds, and a base portion defined between the folds. The device package is coupled to the printed circuit board. The base portion of the heat sink contacts at least a portion of the device package.

41 Claims, 5 Drawing Sheets

HEAT SINK

BACKGROUND OF THE INVENTION

1. Field of the Invention

This invention relates generally to temperature control for an electronic device, and, more particularly, to a heat sink for cooling an electronic device.

2. Description of the Related Art

Heat sinks have been widely used to cool electronic devices. Generally, a heat sink operates in a convective heat transfer mode. The heat dissipation ability of the heat sink is directly proportional to its surface area. A common technique for cooling an electronic device is to provide a metal plate on a surface of the device package and mount a heat sink to the metal plate. The metal plate provides a conductive pathway between a die contained within the device package and the heat sink. The thermal efficiency of the coupling from the die to the heat sink greatly affects the ability of the heat sink to cool the die.

In many cases, the cost of the cooling means (e.g., the heat sink) plays a significant role in determining the overall cost of an electronic device. A manufacturer using electronic devices in bulk can appreciate a large savings in terms of tooling and manufacturing costs if the heat sink design can be simplified.

Referring to FIG. 1, a prior art heat sink 10 is shown. The heat sink 10 includes a plurality of rectangular folds 12. The heat sink 10 is coupled to a device package 14 containing a die 16. A metal plate 18 is provided between the heat sink 10 and the device package 14. The heat sink 10 clips on to the device package 14. Detents 20 formed in the device package 14 interface with feet 22 of the heat sink 10 to provide the connection.

This configuration poses several problems. First, the rectangular folds 12 are not centered about the die 16, thus reducing the efficiency of the heat transfer between the die 16 and the heat sink 10. Second, the device package is more costly to manufacture due to the need to provide the detents 20 for interfacing with the feet 22.

A third problem is that because the heat sink 10 is attached to the device package 14, the possible configurations of the device package 14 are limited, and thus the flexibility of the heat sink 10 is also limited. Because the detents 20 are located on two of the sides of the device package 14, the heat sink 10 may only be used with a device package 14 having pins 24 on two sides. In other words, the heat sink 10 cannot be used with commonly used packages (not shown) having pins on all four sides. Also, if the dimensions of the device package 14 change, the heat sink 10 must be redesigned to provide the proper interface. These items limit the application of a particular heat sink design to a particular package design, in that any changes in the package 14 would require design and tooling changes for the heat sink 10. Accordingly, changes in the device package 14 result in costly changes to the heat sink 10.

The present invention is directed to overcoming, or at least reducing the effects of, one or more of the problems set forth above.

SUMMARY OF THE INVENTION

One aspect of the present invention is seen in a heat sink. The heat sink includes mounting feet, a plurality of folds, and a clip. Each of the folds has a base portion, and the clip couples at least two of the folds together to inhibit fanning in at least a contact region defined by adjacent base portions.

Another aspect of the present invention is seen in an apparatus including a printed circuit board, mounting receptacles on the printed circuit board, a heat sink, and a device package. The heat sink includes feet adapted to interface with the mounting receptacles, a plurality of folds, each having a base portion, and a clip coupling at least two of the folds together to inhibit fanning in at least a contact region defined by adjacent base portions. The device package is coupled to the printed circuit board. The contact region of the heat sink contacts at least a portion of the device package.

Still another aspect of the present invention is seen in an apparatus including a printed circuit board, mounting receptacles on the printed circuit board, a heat sink, and a device package. The heat sink includes feet adapted to interface with the mounting receptacles, a plurality of folds, and a base portion defined between the folds. The device package is coupled to the printed circuit board. The base portion of the heat sink contacts at least a portion of the device package.

BRIEF DESCRIPTION OF THE DRAWINGS

The invention may be understood by reference to the following description taken in conjunction with the accompanying drawings, in which like reference numerals identify like elements, and in which.

Figure 1:
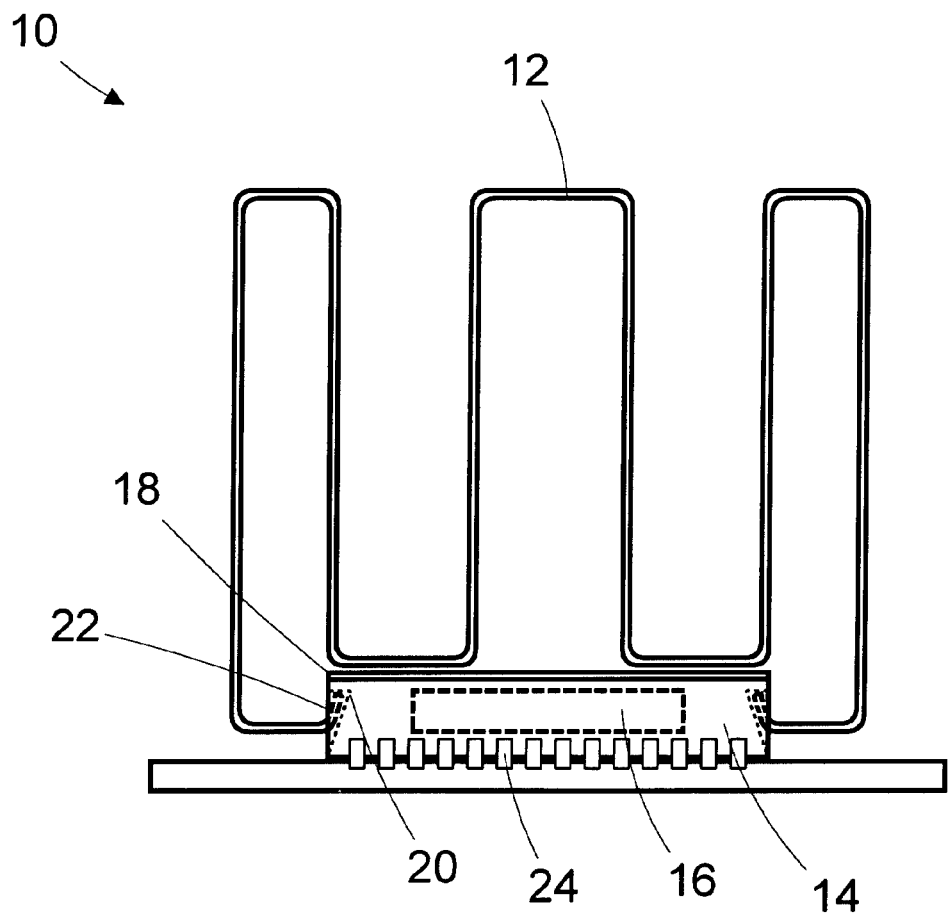
FIG. 1 is a side view of a prior art heat sink for cooling an electronic device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
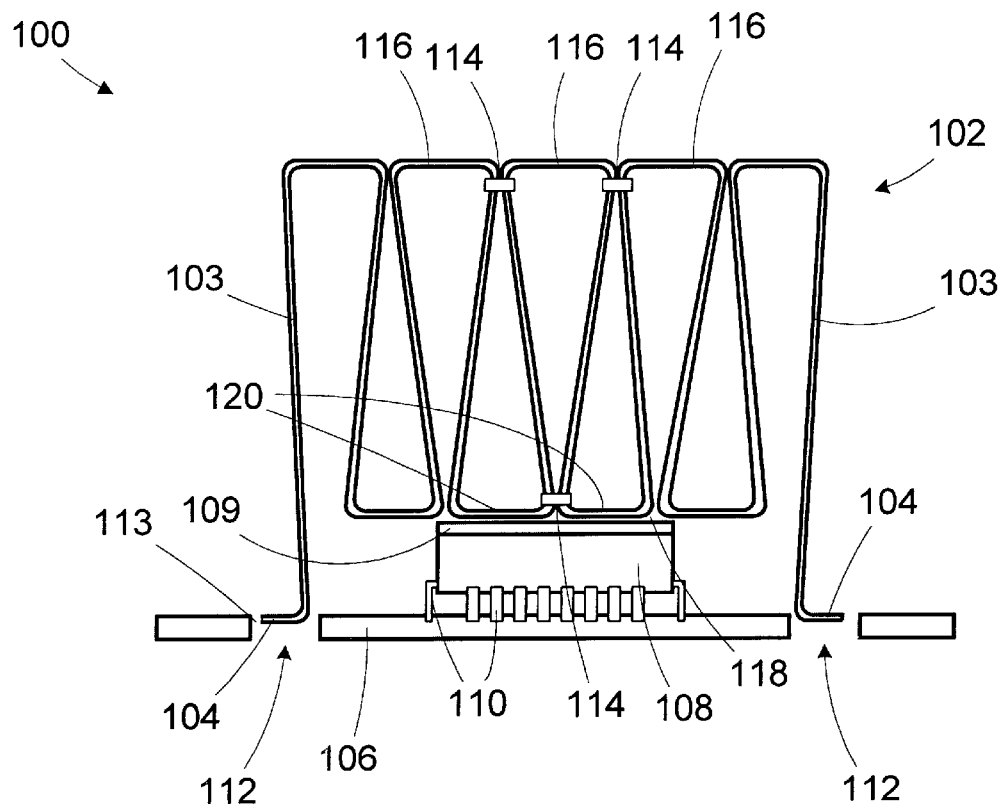
FIG. 2 is a side view of a heat sink in accordance with the present invention.
Figure 3:
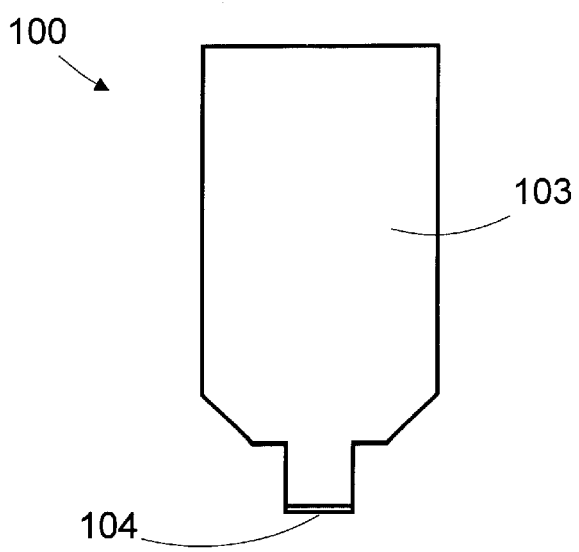
FIG. 3 is an end view of the heat sink of FIG. 2.

Referring now to FIG. 2, a side view of a heat sink 100 in accordance with the present invention is provided. FIG. 3 shows an end view of the heat sink 100. The heat sink 100 includes a plurality of folds 102. Located on outermost folds 103 are feet 104. The feet 104 interface with a printed circuit board 106 for securing the heat sink 100 in place over a device package 108. A metal plate 109 may be located between the device package 108 and the heat sink 100 to enhance the thermal coupling therebetween.

In the illustrated embodiment, the device package 108 has connecting pins 110 on all sides for electrically and mechanically coupling the device package 108 to the printed circuit board 106. Mounting receptacles 112 in the form of slots 113 defined in the printed circuit board 106 receive the feet 104 of the heat sink 100. The feet 104 are compressed inwardly as they are inserted through the slots 113.

Figure 4:
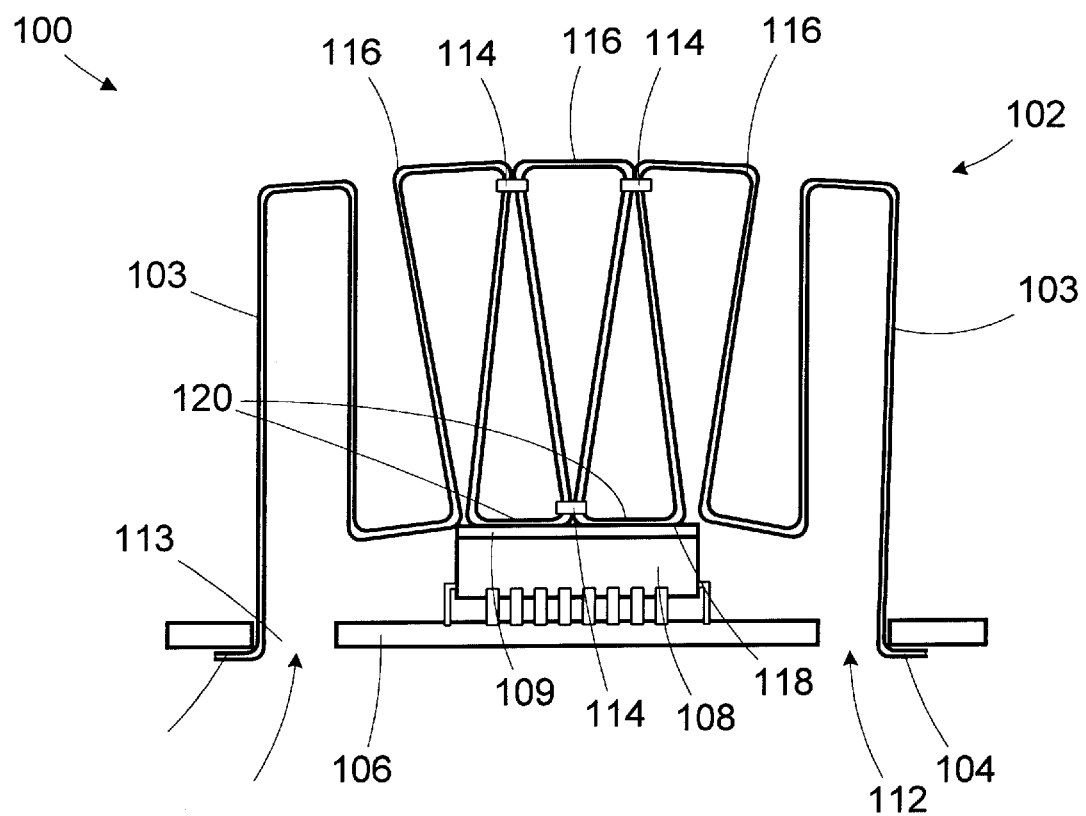
FIG. 4 is a side view of the heat sink of FIG. 2 with the heat sink being engaged with a printed circuit board.

FIG. 4 illustrates the heat sink 100 in a fully engaged position. When released, a horizontal spring force generated by releasing the inward compression retains the feet 104 in the mounting receptacles 112. It is also contemplated that the heat sink 100 may be compressed downwardly as the feet 104 are engaged to provide a vertical component to the spring force. This may be achieved by sizing the outermost folds 103 such that they are slightly shorter than is required to allow the feet 104 to extend through the slot 113. Thus downward and inward compression is applied to extend the feet 104 through the slots 113. When released, horizontal and vertical spring force retains the heat sink 100 in engagement with the mounting receptacles 112.

As seen in FIG. 4, the downward compression tends to cause the folds 102 to fan out horizontally. The amount of fanning illustrated in FIG. 4 is exaggerated for illustrative purposes. Clips 114 are provided on at least some of the inner folds 116 to prevent fanning and maintain a planar contact region 118 between the heat sink 100 and the device package 108. It is contemplated that the clips 114 may also be applied to folds 102 other than the inner folds 116 to prevent fanning. The clips 114 may be separate metal clips that are fitted to the folds 102, or alternatively, the clips 114 may be metal tabs that are integrally formed in some of the folds 112 of the heat sink 100 and folded over to engage the adjacent folds 112.

The triangular nature of the folds 102 increases the surface area of the heat sink 100 by increasing the total number of folds 102 that can be included in the same volume as compared to other rectangular fin or projecting fin arrangements. End portions 120 of the inner folds 116 substantially cover the metal plate 109 to provide a high degree of contact between the metal plate 109 and the heat sink 100 in the planar contact region 118, thus increasing the efficiency of the heat transfer.

The heat sink 100 may be used with a variety of device package 108 types and sizes. For example, the same heat sink 100 may be used with a dual or a quad pin package. The orientation of the device package 108 may be changed on the printed circuit board 106 without requiring relocation of the mounting receptacles 112 or redesign of the heat sink 100. The dimensions of the device package 108 may also be changed without necessitating a change in the heat sink 100 as long as the modified device package 108 fits between the mounting receptacles 112. If the length of the device package 108 is increased, additional clips 114 may be provided to prevent fanning in the correspondingly increased planar contact region 118.

Figure 5A:
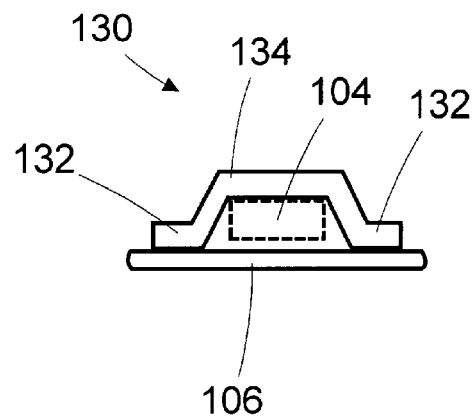
FIGS. 5A, 5B, and 5C are partial side views of alternative mounting receptacles for securing the heat sink of FIG. 2 to the printed circuit board.
Figure 5B:
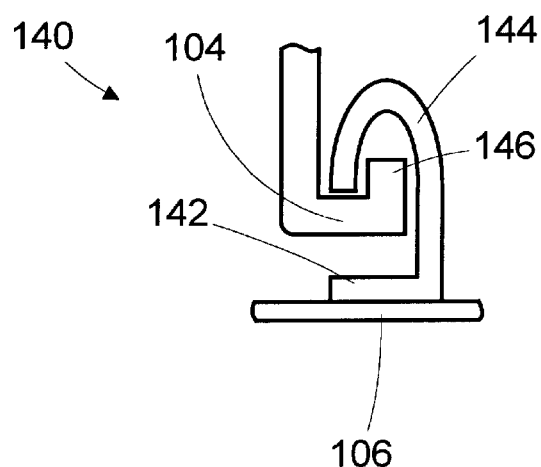
Figure 5C:
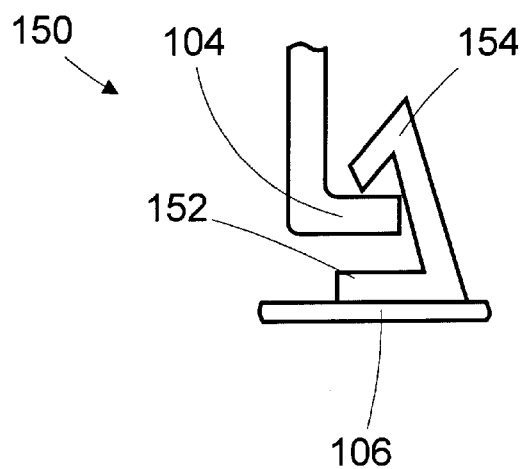

Turning now to FIGS. 5A, 5B, and 5C, alternative mounting receptacles 130, 140, and 150 are illustrated, respectively. In some cases, it may not be desirable to form slots 113 in the printed circuit board 106 due to the presence of electrical traces (not shown) or other devices (not shown) on the opposing side of the printed circuit board 106. The mounting receptacles 130, 140, 150 shown in FIGS. 5A, 5B, 5C may be mounted to the printed circuit board 106 using known surface mount techniques to provide an interface for securing the heat sink 100 in position over the device package 108. The same downward and inward compression described above may be employed.

The alternative mounting receptacle 130 of FIG. 5A includes two contact regions 132 for surface mount connection to the printed circuit board 106. The foot 104 of the heat sink 100 (shown in phantom) is inserted into a cavity defined beneath a ceiling portion 134 of the mounting receptacle 130. The foot 104 interfaces with the ceiling portion 134 to secure the heat sink 100 in place.

The alternative mounting receptacle 140 of FIG. 5B includes a single contact region 142, thus decreasing the footprint of the mounting receptacle 140 and the number of surface mount connections to the printed circuit board 106 as compared to the mounting receptacle 130 of FIG. 5A. The mounting receptacle 140 includes a rounded hook 144 for interfacing with the foot 104 of the heat sink 100. In the particular embodiment illustrated in FIG. 5B, the foot includes an upwardly turned lip 146 to enhance the connection between the foot 104 and the hook 144. The mounting receptacle 140 may be used even if the lip 146 is not present on the foot 104.

The alternative mounting receptacle 150 of FIG. 5C includes a single contact region 152 and an angled hook 154, which is less costly to manufacture than the rounded hook 144 shown in FIG. 5B. The angled hook 154 interfaces with the foot 104 of the heat sink 100. The mounting receptacle 150 may be used to interface with a foot 104 with or without the lip 146 (shown) in FIG. 5B.

Figure 6:
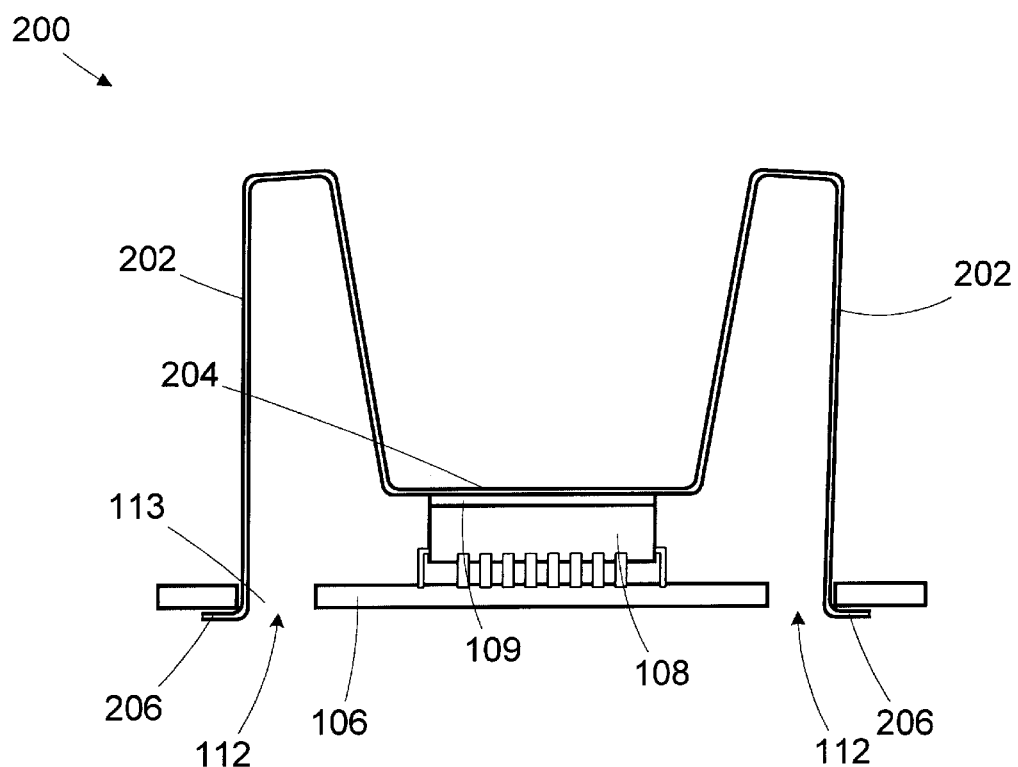
FIG. 6 is an alternative embodiment of a heat sink in accordance with the present invention.

Referring now to FIG. 6, a side view of an alternative embodiment of a heat sink 200 in accordance with the present invention is provided. The heat sink 200 includes folds 202 and a base portion 204. Located on the folds 202 are feet 206. The feet 206 interface with the printed circuit board 106 for securing the heat sink 200 in place over the device package 108. The base portion 204 interfaces with the device package 108 to affect heat transfer therebetween. The device package 108 may also include the metal plate 109 to enhance heat transfer. The mounting receptacles 112 defined in the printed circuit board 106 receive the feet 206 of the heat sink 200. The alternative mounting receptacles 130, 140, 150 may also be used in conjunction with the heat sink 200. The heat sink 200 is mounted in a similar manner to the heat sink 100 described above in reference to FIG. 2.

The heat sinks 100, 200 described herein provide low cost, highly adaptable designs for interfacing various device package 108 sizes and types. The combination of the triangular folds 102 and the anti-fanning clips 114 of the heat sink of FIG. 2 provide additional convective heat transfer surface area and maintain the integrity of the conductive heat transfer area between the heat sink 100 and the device package 108. The simple construction of the heat sink 200 of FIG. 6 results in a low-cost, highly adaptable heat sink 200. The variety of mounting receptacles 112, 130, 140, 150 suitable for use with the heat sinks 100, 200 also increase the range of applicability for the heat sinks 100, 200.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A heat sink, comprising:
   mounting feet;
   a plurality of folds, each having a base portion; and
   a clip coupling at least two of the folds together to inhibit fanning in at least a contact region defined by adjacent base portions.

2. The heat sink of claim 1, wherein the folds are substantially triangular.

3. The heat sink of claim 1, wherein each foot includes an upwardly turned lip.

4. The heat sink of claim 2, further comprising a plurality of clips coupling the bases of adjacent triangular folds.

5. The heat sink of claim 1, wherein the clip comprises a metal tab formed in one of the folds, the tab engaging an adjacent one of the folds.

6. An apparatus, comprising:
   a printed circuit board;
   mounting receptacles on the printed circuit board;
   a heat sink comprising:
      feet adapted to interface with the mounting receptacles;
      a plurality of folds, each having a base portion; and
      a clip coupling at least two of the folds together to inhibit fanning in at least a contact region defined by adjacent base portions; and
   a device package coupled to the printed circuit board, the contact region of the heat sink contacting at least a portion of the device package.

7. The apparatus of claim 6, wherein the mounting receptacles comprise slots defined in the printed circuit board.

8. The apparatus of claim 6, wherein each of the mounting receptacles comprise a surface mount contact region for coupling the mounting receptacle to the printed circuit board and a hook portion for interfacing with one of the feet of the heat sink.

9. The apparatus of claim 8, wherein the hook portion is rounded.

10. The apparatus of claim 8, wherein the hook portion is angled.

11. The apparatus of claim 6, wherein each of the mounting receptacles comprise first and second surface mount contact regions for coupling the mounting receptacle to the printed circuit board and a ceiling portion for interfacing with one of the feet of the heat sink.

12. The apparatus of claim 6, wherein the folds of the heat sink are substantially triangular.

13. The apparatus of claim 6, wherein each foot of the heat sink includes an upwardly turned lip.

14. The apparatus of claim 6, further comprising a plurality of clips coupling the bases of adjacent triangular folds of the heat sink.

15. The apparatus of claim 6, further comprising a metal plate coupled to the device package between the contact region of the heat sink and the device package, the contact region of the heat sink contacting at least a portion of the metal plate.

16. The apparatus of claim 6, wherein the device package includes a plurality of contact pins on a side of the device package proximate the mounting receptacles.

17. The apparatus of claim 6, wherein the device package includes a plurality of contact pins on each side of the device package.

18. The apparatus of claim 6, wherein the clip comprises a metal tab formed in one of the folds, the tab engaging an adjacent one of the folds.

19. A method for assembling an electronic device, comprising:
   providing a printed circuit board;
   mounting a device package on the printed circuit board;
   providing mounting receptacles on the printed circuit board proximate the device package;
   forming a heat sink, the heat sink including feet and a plurality of folds, each fold having a base portion;
   coupling the feet of the heat sink to the mounting receptacles; and
   coupling at least two of the folds together to inhibit fanning in at least a contact region defined by adjacent base portions, the contact region of the heat sink contacting at least a portion of the device package.

20. The method of claim 19, wherein providing the mounting receptacles comprises forming slots in the printed circuit board.

21. The method of claim 19, wherein providing the mounting receptacles comprises providing a surface mount receptacle having a surface mount contact region for coupling the surface mount receptacle to the printed circuit board and a hook portion for interfacing with one of the feet of the heat sink.

22. The method of claim 19, wherein providing the mounting receptacles comprises providing a surface mount receptacle having first and second surface mount contact regions for coupling the mounting receptacle to the printed circuit board and a ceiling portion for interfacing with one of the feet of the heat sink.

23. The method of claim 19, wherein forming the heat sink includes forming substantially triangular folds.

24. The method of claim 19, wherein forming the heat sink includes forming an upwardly turned lip on each of the feet.

25. The method of claim 19, wherein coupling the folds includes coupling the folds with a clip.

26. The method of claim 19, wherein coupling the folds includes folding a tab formed in one of the folds to engage an adjacent one of the folds.

27. The method of claim 19, further comprising a coupling the bases of adjacent triangular folds of the heat sink with a plurality of clips.

28. The method of claim 19, further comprising coupling a metal plate to the device package between the contact region of the heat sink and the device package, the contact region of the heat sink contacting at least a portion of the metal plate.

29. The method of claim 19, wherein the device package includes a plurality of contact pins on a side of the device package, and mounting the device package to the printed circuit board includes positioning the contact pins proximate the mounting receptacles.

30. The method of claim 19, wherein mounting the device package to the printed circuit board includes mounting the device package including a plurality of contact pins on each side of the device package proximate the mounting receptacles.

31. An apparatus, comprising:
   a printed circuit board;
   mounting receptacles on the printed circuit board;
   a heat sink comprising:
      a base portion;
      a plurality of compressible folds extending from the base portion, each of at least two compressible folds terminating in a foot, the foot interfacing with the mounting receptacle and being maintained in position by a spring force generated by a deflection of the at least two compressible folds; and a plurality of folds; and a device package coupled to the printed circuit board, the base portion of the heat sink contacting at least a portion of the device package.

32. The apparatus of claim 31, wherein the mounting receptacles comprise slots defined in the printed circuit board.

33. The apparatus of claim 31, wherein each of the mounting receptacles comprise a surface mount contact region for coupling the mounting receptacle to the printed circuit board and a hook portion for interfacing with one of the feet of the heat sink.

34. The apparatus of claim 33, wherein the hook portion is rounded.

35. The apparatus of claim 33, wherein the hook portion is angled.

36. The apparatus of claim 31, wherein each of the mounting receptacles comprise first and second surface mount contact regions for coupling the mounting receptacle to the printed circuit board and a ceiling portion for interfacing with one of the feet of the heat sink.

37. The apparatus of claim 31, wherein each foot of the heat sink includes an upwardly turned lip.

38. The apparatus of claim 31, further comprising a metal plate coupled to the device package between the base region of the heat sink and the device package, the base region of the heat sink contacting at least a portion of the metal plate.

39. The apparatus of claim 31, wherein the device package includes a plurality of contact pins on a side of the device package proximate the mounting receptacles.

40. The apparatus of claim 31, wherein the device package includes a plurality of contact pins on each side of the device package.

41. An apparatus, comprising:

a printed circuit board;

a heat sink comprising:
 a base portion;
 a plurality of compressible folds extending from the base portion, each of at least two compressible folds terminating in a foot; and means for mounting the feet to the printed circuit board, each foot interfacing with the mounting means and being maintained in position by a spring force generated by a deflection of the at least two compressible folds; and a device package coupled to the printed circuit board, the base portion of the heat sink contacting at least a portion of the device package.

* * * * *